(12) United States Patent
Chang et al.

(10) Patent No.: US 11,707,003 B2
(45) Date of Patent: Jul. 18, 2023

(54) MEMORY DEVICE AND MANUFACTURING METHOD THEREOF

(71) Applicant: United Microelectronics Corp., Hsinchu (TW)

(72) Inventors: Chich-Neng Chang, Pingtung County (TW); Da-Jun Lin, Kaohsiung (TW); Shih-Wei Su, Tainan (TW); Fu-Yu Tsai, Tainan (TW); Bin-Siang Tsai, Changhua County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 17/140,981

(22) Filed: Jan. 4, 2021

(65) Prior Publication Data
US 2022/0173311 A1    Jun. 2, 2022

(30) Foreign Application Priority Data
Dec. 1, 2020   (CN) .......................... 202011388129.6

(51) Int. Cl.
*H10N 70/20*      (2023.01)
*H10B 63/00*      (2023.01)
*H10N 70/00*      (2023.01)

(52) U.S. Cl.
CPC .............. *H10N 70/24* (2023.02); *H10B 63/30* (2023.02); *H10N 70/063* (2023.02); *H10N 70/826* (2023.02); *H10N 70/841* (2023.02)

(58) Field of Classification Search
CPC . H01L 45/08; H01L 45/1233; H01L 45/1253; H10N 70/24; H10N 70/063; H10N 70/826; H10N 70/841
See application file for complete search history.

(56) References Cited

U.S. PATENT DOCUMENTS

| | | | |
|---|---|---|---|
| 6,825,529 B2 | 11/2004 | Chidambarrao et al. | |
| 7,247,582 B2 | 7/2007 | Stern et al. | |
| 10,153,432 B2 | 12/2018 | Zhu | |
| 2010/0078615 A1* | 4/2010 | Ito | H01L 45/146 257/E49.001 |
| 2011/0278529 A1* | 11/2011 | Xu | B82Y 10/00 257/E45.001 |
| 2012/0012954 A1* | 1/2012 | Yamada | H01L 43/12 257/E29.323 |
| 2012/0217594 A1* | 8/2012 | Kajiyama | H01L 27/228 257/E29.323 |
| 2014/0284542 A1* | 9/2014 | Matsuo | H01L 45/12 257/4 |

* cited by examiner

*Primary Examiner* — Shih Tsun A Chou
(74) *Attorney, Agent, or Firm* — J.C. Patents

(57) ABSTRACT

A memory device and a manufacturing method thereof are provided. The memory device includes a device substrate, a resistance variable layer and a top electrode. The bottom electrode is disposed on the device substrate. The resistance variable layer is disposed on the bottom electrode. The top electrode is disposed on the resistance variable layer. The bottom electrode is formed with a tensile stress, while the top electrode is formed with a compressive stress.

13 Claims, 14 Drawing Sheets

MEMORY DEVICE AND MANUFACTURING METHOD THEREOF

CROSS-REFERENCE TO RELATED APPLICATION

This application claims the priority benefit of Chinese application serial no. 202011388129.6, filed on Dec. 1, 2020. The entirety of the above-mentioned patent application is hereby incorporated by reference herein and made a part of this specification.

BACKGROUND OF THE INVENTION

Field of the Invention

The invention relates to a memory device and a manufacturing method thereof.

Description of Related Art

Most modern electronic apparatus include electronic memory devices for data storage. The electronic memory devices can be categorized into volatile memory devices and non-volatile memory devices. The volatile memory devices can only store data when power supply is maintained, while the non-volatile memory devices can retain data even when power supply is cut off. Resistive random access memory (MRAM) is a promising one of the non-volatile memory devices, since it has merits including small footprint area, low switching voltage and short switching time, along with compatibility with complementary metal oxide semiconductor (CMOS) process and so forth.

SUMMARY OF THE INVENTION

In an aspect of the present disclosure, a memory device is provided. The memory device comprises: a device substrate; a bottom electrode, disposed on the device substrate; a resistance variable layer, disposed on the bottom electrode; and a top electrode, disposed on the resistance variable layer, wherein the bottom electrode is formed with a tensile stress, and the top electrode is formed with a compressive stress.

In some embodiments, the bottom electrode and the top electrode respectively provide a stress field toward the resistance variable layer.

In some embodiments, the resistance variable layer is subjected to a compressive stress in corresponding to the stress fields provided by the bottom electrode and the top electrode.

In some embodiments, the bottom electrode and the top electrode are formed of the same conductive material.

In some embodiments, a material of the bottom electrode and a material of the top electrode respectively include titanium nitride, tantalum nitride, tantalum or combinations thereof.

In some embodiments, the memory device further comprises: a capping layer, covering sidewalls of the bottom electrode, the resistance variable layer and the top electrode, and formed with a compressive stress.

In some embodiments, the bottom electrode, the top electrode and the capping layer respectively provide a stress field toward the resistance variable layer, and the resistance variable layer is subjected to a compressive stress in correspondence to the stress fields.

In some embodiments, the capping layer is formed as a wall structure, the wall structure laterally surrounds the bottom electrode, the resistance variable layer and the top electrode.

In some embodiments, the capping layer laterally surrounds the bottom electrode, the resistance variable layer and the top electrode, and further covers a top surface of the top electrode.

In some embodiments, a material of the capping layer comprises silicon nitride, aluminum nitride or a combination thereof.

In another aspect of the present disclosure, a memory device is provided. The memory device comprises: a bottom electrode with a first stress and a top electrode with a second stress, formed in a back-end-of-line (BEOL) structure over a semiconductor substrate, wherein the top electrode is located over the bottom electrode, and overlapped with the bottom electrode; and a resistance variable layer, sandwiched between the bottom electrode and the top electrode, and subjected to a compressive strain in corresponding to the first stress of the bottom electrode and the second stress of the top electrode.

In some embodiments, the memory device further comprises: a stressed layer, covering sidewalls of the top electrode, the resistance variable layer and the bottom electrode, and formed with a third stress.

In some embodiments, the resistance variable layer is further subjected to a compressive strain in corresponding to the third stress of the stressed layer.

In yet another aspect of the present disclosure, a manufacturing method of a memory device is provided. The method comprises: sequentially forming a bottom electrode layer, a resistance variable material layer, a top electrode layer and a hard mask layer on a device substrate, wherein the bottom electrode is formed with a tensile stress, and the top electrode is formed with a compressive stress; patterning the hard mask layer, to form a hard mask; removing portions of the top electrode layer, the resistance variable material layer and the bottom electrode layer by using the hard mask as a shadow mask, to form a top electrode, a resistance variable layer and a bottom electrode, respectively; removing the hard mask.

In some embodiments, the bottom electrode layer is formed by a physical vapor deposition (PVD) process using both of a direct current (DC) power source and a radio frequency (RF) alternating current (AC) power source, and the top electrode is formed by a PVD process using a DC power source without turning on a RF AC power source.

In some embodiments, the method further comprises: forming a capping material layer covering exposed surfaces of the top electrode, the resistance variable layer and the bottom electrode after removal of the hard mask, wherein the capping material layer is formed with a compressive stress.

In some embodiments, the method further comprises: performing an anisotropic etching process on the capping material layer after formation of the capping material layer, to remove a portion of the capping material layer covering a top surface of the top electrode.

In some embodiments, the capping material layer is formed without being subjected to an ion implantation process.

In some embodiments, the capping material layer is formed by a chemical vapor deposition (CVD) process using a DC power source and a RF AC power source.

In some embodiments, the portions of the top electrode layer, the resistance variable material layer and the bottom electrode layer are removed for forming the top electrode, the resistance variable layer and the bottom electrode by multiple anisotropic etching processes.

Based on above, the memory integrated circuit according to embodiments of the present disclosure may be a resistive memory integrated circuit, and the resistance variable layer in the resistance variable device of each memory cell of the memory integrated circuit is subjected to compressive stress (may induce compressive strain) as a result of the stress field(s) generated by one or more of the surrounding layers. Specifically, at least one of the top electrode and the bottom electrode at top and bottom sides of the resistance variable layer may be configured to generate a stress field toward the resistance variable layer, such that the resistance variable layer can be subjected to compressive stress (may induce compressive strain). Further, the capping layer at least covering a sidewall of the resistance variable layer may be optionally configured to generate a stress field toward the resistance variable layer from around the resistance variable layer, so as to further increase the compressive stress (and the induced compressive strain) of the resistance variable layer. Such compressive stress/strain may be advantageous to formation of a conductive path in the resistance variable layer, as well as cut off or removal of the conductive path in the resistance variable layer. Therefore, a programming operation and an erase operation can be performed with a lower operation voltage, and can be performed in a shorter period of time. As a result, power consumption of the memory integrated circuit can be lowered, and an operation speed of the memory integrated circuit can be improved.

BRIEF DESCRIPTION OF THE DRAWINGS

In order to make the aforementioned and other objectives and advantages of the present invention comprehensible, embodiments accompanied with figures are described in detail below.

DESCRIPTION OF THE EMBODIMENTS

Figure 1A:
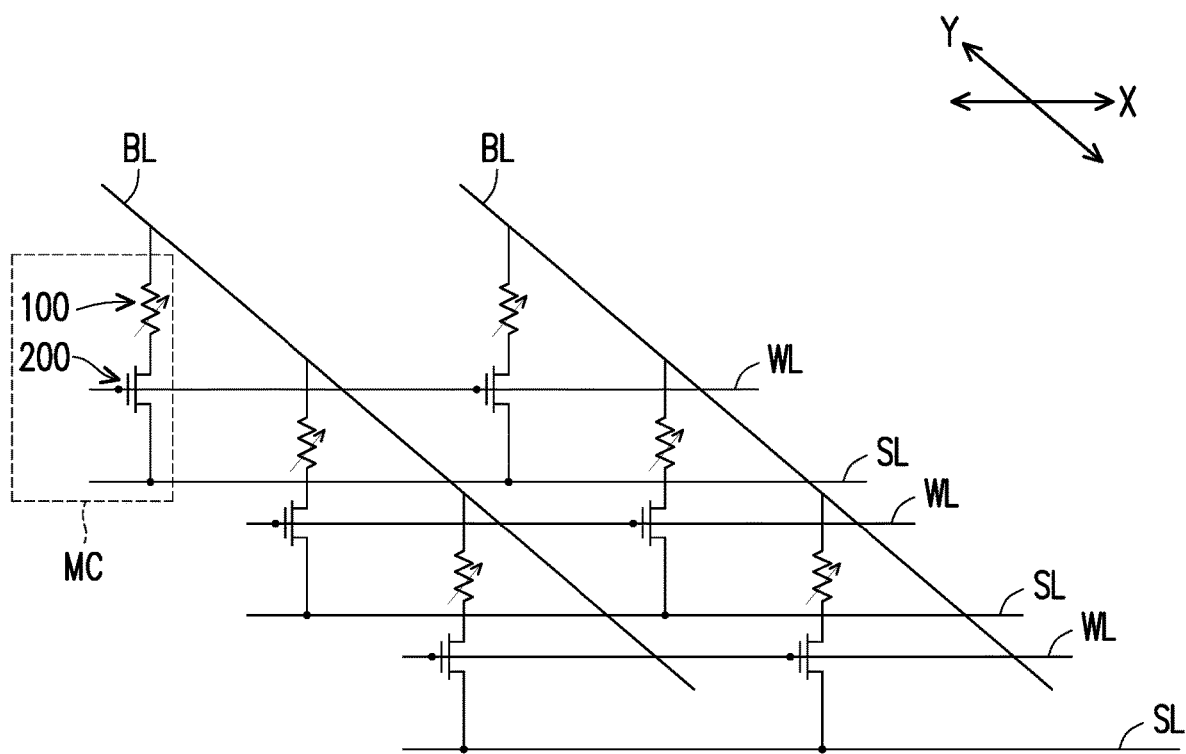
FIG. 1A is an equivalent circuit diagram of a memory integrated circuit according to some embodiments of the present disclosure.
Figure 1B:
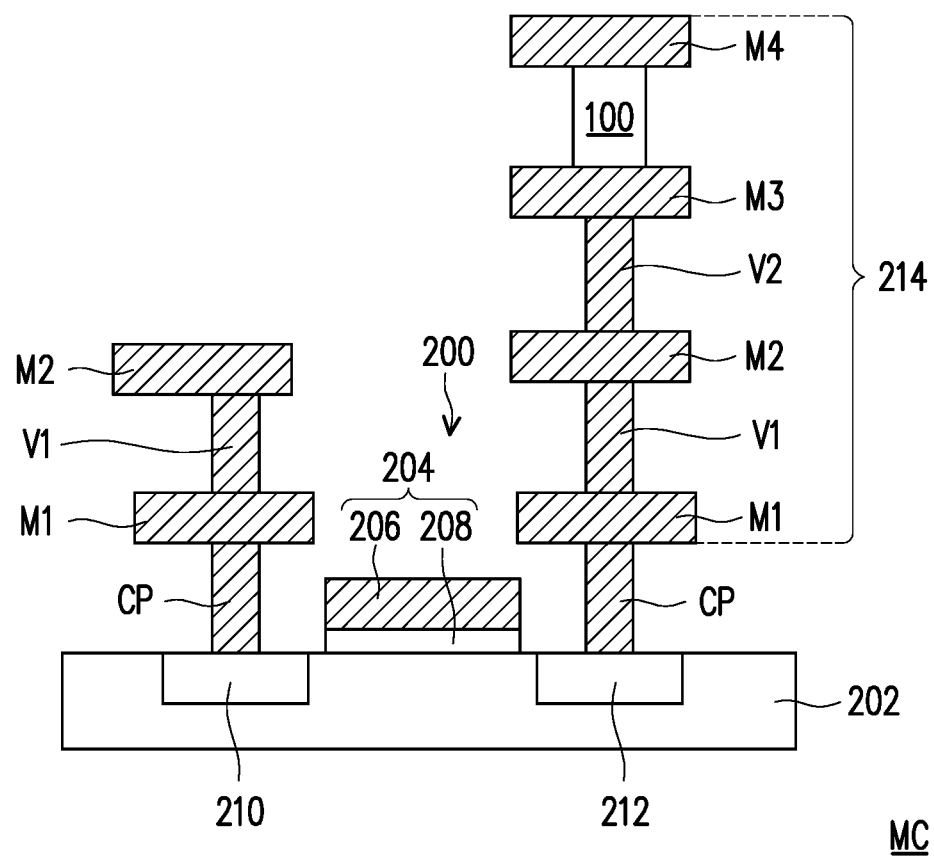
FIG. 1B is a schematic diagram illustrating one of the memory cells as shown in FIG. 1A.
Figure 1C:
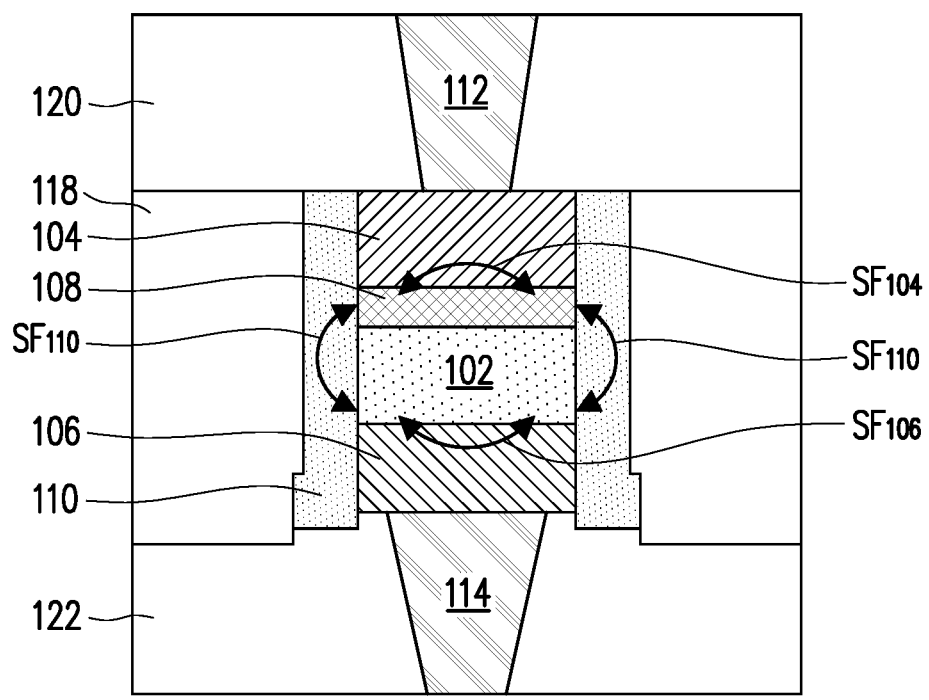
FIG. 1C is a schematic cross-sectional view illustrating the resistance variable device as shown in FIG. 1A and FIG. 1B.
Figure 1D:
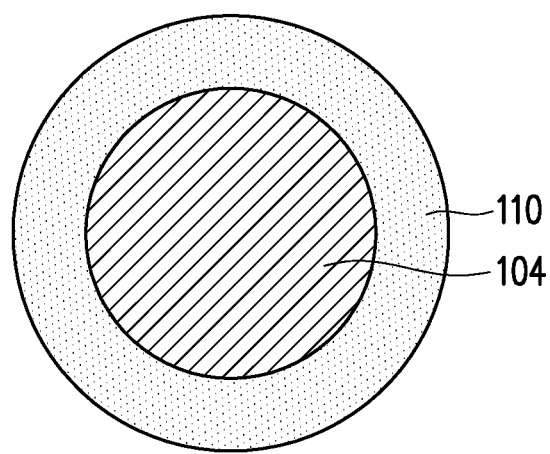
FIG. 1D is a schematic top view illustrating the resistance variable device as shown in FIG. 1C.

FIG. 1A is an equivalent circuit diagram of a memory integrated circuit 10 according to some embodiments of the present disclosure. FIG. 1B is a schematic diagram illustrating one of the memory cells MC as shown in FIG. 1A. FIG. 1C is a schematic cross-sectional view illustrating the resistance variable device 100 as shown in FIG. 1A and FIG. 1B. FIG. 1D is a schematic top view illustrating the resistance variable device 100 as shown in FIG. 1C.

Referring to FIG. 1A, the memory integrated circuit 10 may be a resistive memory integrated circuit, or referred as a resistive memory for short. The memory integrated circuit 10 includes multiple memory cells MC, or referred as memory devices. The memory cells MC are arranged in an array having multiple rows extending along a direction X, and multiple columns extending along a direction Y. Each of the memory cells MC includes a resistive variable device 100 and an access transistor 200 electrically connected to the resistive variable device 100. The resistance variable device 100 may be a two-terminal device. By adjusting voltages supplied to the two terminals of the resistance variable device 100, a resistance state of the resistance variable device 100 can be switched. For instance, a resistance between the two terminals of the resistance variable device 100 can be switched to a low resistance state from a high resistance state, or vice versa. Accordingly, the resistance variable device 100 can be configured to store a high logic state and a low logic state. A terminal of each resistance variable device 100 may be electrically connected to the corresponding access transistor 200, and the other terminal may be electrically connected to a bit line BL. On the other hand, the access transistor 200 may be a three-terminal device, such as a field effect transistor (FET). A gate terminal of each access transistor 200 may be coupled to a word line WL. In addition, a source/drain terminal of each access transistor 200 may be electrically connected to the corresponding resistance variable device 100, while the other source/drain terminal may be electrically connected to a source line SL. In other words, a terminal of each resistance variable device 100 may be electrically connected to a source/drain terminal of the corresponding access transistor 200, while the other terminal may be electrically connected to the corresponding bit line BL. Therefore, switching of each access transistor 200 can determine an electrical potential of a terminal of the corresponding resistance variable device 100, thus affect potential difference across the terminals of the corresponding resistance variable device 100. As a result, each access transistor 200 can be configured to control access of the resistance variable device 100 electrically connected thereto. The word lines WL and the source lines SL are depicted as extending along the direction X, while the bit lines BL are depicted as extending along the direction Y. However, those skilled in the art may modify extending directions of the word lines WL, the source lines SL and the bit lines BL according to design and process requirements. The word lines WL, the source lines SL and the bit lines BL may respectively extend along the direction X or the direction Y, the present disclosure is not limited to the extending directions of these signal lines.

Referring to FIG. 1A and FIG. 1B, the access transistor 200 of each memory cell MC may be formed on a skin region of a substrate 202. The substrate 202 may be a semiconductor wafer or a semiconductor-on-insulator (SOI) wafer. Each access transistor 200 may include a gate structure 204 disposed on the substrate 202. The gate structure 204 may include a gate electrode 206 and a gate dielectric layer 208 lying between the gate electrode 206 and the substrate 202. The gate electrode 206 may be a portion of one of the word lines WL as described with reference to FIG. 1A. In some embodiments, an interface between the gate structure 204 and the substrate 200 is substantially flat. In these embodiments, the access transistor 200 may be referred as a planar type FET. In alternative embodiments, a skin region of the substrate 202 may be shaped into fin structures, or channel structures vertically spaced apart from one another may be formed on the substrate 200. In these alternative embodiments, the gate structure 204 may intersect with at least one fin structure or at least one stack of the channel structures, and cover surfaces of the at least one fin structure or the at least one stack of the channel structures. Further, the access transistors 200 according to these alternative embodiments may be a fin type FET (fin-FET) or a gate-all-around (GAA) FET. Moreover, each access transistor 200 may further include source/drain structures 210, 212 at opposite sides of the gate structure 204. In some embodiments, the source/drain structures 210, 212 are doped regions formed in the substrate 202. In other embodiments, the source/drain structures 210, 212 are epitaxial structures formed in recesses at a surface of the substrate 202, or epitaxial structures formed over the substrate 202.

In some embodiments, each memory cell MC further includes contact plugs CP standing on the source/drain structures 210, 212, and includes a back-end-of-line (BEOL) structure 214 located on the contact plugs CP and electrically connected to the contact plugs CP. The BEOL structure 214 includes multiple metallization layers (e.g., including metallization layers M1, M2, M3 and M4), and includes conductive vias located and electrically connected between the metallization layers (e.g., including conductive vias V1 between the metallization layers M1, M2, and including a conductive via V2 between the metallization layers M2, M3). In addition, the resistance variable device 100 may be embedded in the BEOL structure 214. The bottommost metallization layer (e.g., the metallization layer M1) may be electrically connected to the contact plugs CP. In some embodiments, first portions of the metallization layers M1, M2 and the conductive vias V1 may be electrically connected to one of the source/drain structures of the access transistors 200 (e.g., the source/drain structure 210) through one of the contact plugs CP, and the first portion of the metallization layer M2 may be a portion of one of the source lines SL described with reference to FIG. 1A. On the other hand, second portions of the metallization layers M1, M2 and the conductive vias V1 may be electrically connected to the other source/drain structure of the access transistor 200 (e.g., the source/drain structure 212) through another contact plug CP, along with the metallization layers M3, M4 and the conductive via V2. Further, the resistance variable device 100 may be disposed between and electrically connected to the metallization layers M3, M4. Accordingly, the resistance variable device 100 may be electrically connected to one of the source/drain structures of the access transistor 200 (e.g., the source/drain structure 212) through the underlying metallization layers and conductive vias (e.g., the metallization layer M3 and the conductive via V2, along with the second portions of the metallization layers M1, M2 and the conductive vias V1). Meantime, the metallization layer M4 over the resistance variable device 100 may be a portion of one of the bit lines BL as described with reference to FIG. 1A. However, those skilled in the art may form more or less of the metallization layers and the conductive vias according to process and/or design requirements, and may modify location of the resistance variable device 100. The present disclosure is not limited to an amount of the metallization layers and a location of the resistance variable device 100 in the BEOL structure 214.

Referring to FIG. 1B and FIG. 1C, each resistance variable device 100 includes a resistance variable layer 102. In an initial state of the resistance variable device 100 (i.e., the state in which the resistance variable layer 102 is not programmed), the resistance variable layer 102 may be insulating, thus in a high resistance state. During a programming operation, a conductive path (not shown), also referred as a conductive filament, may be formed in the resistance variable layer 102 by adjusting a voltage bias across top and bottom sides of the resistance variable layer 102. Such conductive path may extend from a bottom surface of the resistance variable layer 102 to a top surface of the resistance variable layer 102. Accordingly, a resistance measured across the top and bottom sides of the resistance variable layer 102 may be lowered, and the resistance variable layer 102 may exhibit a low resistance state. On the other hand, during an erase operation, a reverse voltage bias (i.e., a voltage bias with a direction opposite to the voltage bias used during a programming operation) may be applied across the top and bottom sides of the resistance variable layer 102, so as to cut off or remove a possible conductive path previously formed in the resistance variable layer 102. As such, the resistance variable layer 102 may exhibit the high resistance state once again. Formation and cut off/removal of the conductive path may be related to movement of oxygen vacancies in the resistance variable layer 102, and such movement is dependent on the voltage bias across the top and bottom sides of the resistance variable layer 102. Formation of the conductive path may be resulted from accumulation of the oxygen vacancies, and cut off/removal of the conductive path may be resulted from dispersion of the oxygen vacancies. In addition, stress applied to the resistance variable layer 102 may further affect the movement of the oxygen vacancies. In some embodiments, the resistance variable layer 102 is subjected to a compressive stress, and a compressive strain may be induced accordingly. In these embodiments, the compressive stress (and the induced compressive strain) is advantageous to the movement of the oxygen vacancies, such that the programming operation and the erase operation can be performed by using a lower operation voltage. Moreover, the conductive path may be formed or cut off/removed in a shorter period of time, as a result of such compressive stress (and the induced compressive strain). Therefore, a speed of the programming operation and the erase operation can be improved. The resistance variable layer 102 may be a single layer or a multilayer structure, and material(s) of the resistance variable layer 102 may include tantalum oxide, hafnium oxide, titanium oxide, the like or combinations thereof.

Each resistance variable device 100 further includes a top electrode 104 and a bottom electrode 106. The top electrode 104 is disposed on the resistance variable layer 102, while the bottom electrode 106 is located below the resistance variable layer 102. The voltage bias across the top and bottom sides of the resistance variable layer 102 may be adjusted by controlling the voltages supplied to the top electrode 104 and the bottom electrode 106, thus a resistance state of the resistance variable layer 102 can be switched. Further, the top electrode 104 and/or the bottom electrode 106 is/are configured to apply a stress field toward the resistance variable layer 102, such that the resistance variable layer 102 can be subjected to a compressive stress (which may induce a compressive strain). Accordingly, the operation voltage used for performing a programming operation and an erase operation on the resistance variable layer 102 may be lowered. In some embodiments, the top electrode 104 is formed with a compressive stress, and may apply a stress field $SF_{104}$ toward the resistance variable layer 102 from above the resistance variable layer 102. As a result of the stress field $SF_{104}$, the resistance variable layer 102 may be subjected to a compressive stress (which may induce a compressive strain). For instance, the compressive stress of the top electrode 104 may range from about −50 MPa to about −1000 MPa. On the other hand, in some embodiments, the bottom electrode 106 is formed with a tensile stress, and may apply a stress field $SF_{106}$ toward the resistance variable layer 102 from below the resistance variable layer 102. As similar to the stress field $SF_{104}$, the stress field $SF_{106}$ may result in compressive stress and compressive strain of the resistance variable layer 102 as well. For instance, the tensile stress of the bottom electrode 106 may range from about 50 MPa to about 1000 MPa. In embodiments depicted by FIG. 1C, the top electrode 104 and the bottom electrode 106 are configured to apply the stress fields $SF_{104}$, $SF_{106}$ toward the resistance variable layer 102. However, in alternative embodiments, only one of the top electrode 104 and the bottom electrode 106 is configured to apply the stress field (e.g., the stress field $SF_{104}$ or the stress field $SF_{106}$) toward the resistance variable layer 102, and the other one may be substantially stress-free. For instance, the term "stress-free" used for describing a material layer is referred that the material layer with a stress having an absolute value less than about 50 MPa. The top electrode 104 and the bottom electrode 106 may respectively be formed of a conductive material. For instance, the conductive material may include titanium nitride, tantalum nitride, tantalum, the like or combinations thereof.

In some embodiments, each resistance variable device 100 further includes an interfacial layer 108. The interfacial layer 108 is disposed between the top electrode 104 and the resistance variable layer 102. Alternatively, the top electrode 104 and the interfacial layer 108 may be collectively referred as a composite top electrode. The interfacial layer 108 may be formed of an inert metal (e.g., ruthenium), and may prevent oxygen vacancies from being trapped between the top electrode 104 and the resistance variable layer 102. The trapping of the oxygen vacancies may result in undesired variation of the operation voltage applied during a programming operation or an erase operation.

Referring to FIG. 1C and FIG. 1D, in some embodiments, each resistance variable device 100 further includes a capping layer 110. In some embodiments, the capping layer 110 is formed as a wall structure, and laterally surrounds a stacking structure formed of the top electrode 104, the resistance variable layer 102 and the bottom electrode 106 (or formed of the top electrode 104, the interfacial layer 108, the resistance variable layer 102 and the bottom electrode 106). In other words, the capping layer 110 may be in lateral contact with the top electrode 104, the resistance variable layer 102 and the bottom electrode 106 (or in lateral contact with the top electrode 104, the interfacial layer 108, the resistance variable layer 102 and the bottom electrode 106). Further, the capping layer 110 may be configured to apply a stress field toward the resistance variable layer 102, such that the resistance variable layer 102 may be subjected to further compressive stress (which may induce additional compressive strain). In some embodiments, the capping layer 110 is formed with a compressive stress, and may apply a stress field $SF_{110}$ toward the resistance variable layer 102 from around the resistance variable layer 102. As similar to the stress field $SF_{104}$ and the stress field $SF_{106}$, the stress field $SF_{110}$ may result in compressive stress/compressive strain of the resistance variable layer 102 as well. In those embodiments where the top electrode 104, the bottom electrode 106 and the capping layer 110 are all configured to apply stress fields toward the resistance variable layer 102 (i.e., the stress fields $SF_{104}$, $SF_{106}$, $SF_{110}$), the resistance variable layer 102 may be regarded as being located in a stress cage, and the compressive stress/strain of the resistance variable layer 102 can be maximized. In alternative embodiments, the capping layer 110 is substantially stress-free, and has a stress with an absolute value less than about 50 MPa. The capping layer 110 may be formed of an insulating material. For instance, the insulating material may include silicon nitride or aluminum nitride.

In some embodiments, each resistance variable device 100 further includes a top conductive via 112 and a bottom conductive via 114. The top conductive via 112 may stand on a top surface of the top electrode 104, and electrically connect the top electrode 104 to an overlying metallization layer (e.g., the metallization layer M4 as described with reference to FIG. 1B). On the other hand, the bottom conductive via 114 may be disposed below the bottom electrode 106, and electrically connect the bottom electrode 106 to an underlying metallization layer (e.g., the metallization layer M3 as described with reference to FIG. 1B). The top conductive via 112 and the bottom conductive via 114 may be formed of a conductive material. For instance, the conductive material may include aluminum, copper, aluminum-copper alloy, titanium, titanium nitride, tantalum, tantalum nitride, tungsten, the like or combinations thereof. In addition, it should be noted that, the top conductive via 112 is omitted from the schematic top view shown in FIG. 1D.

In some embodiments, each resistance variable device 100 is disposed in a stack of dielectric layers 116. For instance, the stack of dielectric layers 116 may include dielectric layers 118, 120, 122. The dielectric layer 118 laterally surrounds a stacking structure formed of the top electrode 104, the resistance variable layer 102 and the bottom electrode 106 (or formed of the top electrode 104, the interfacial layer 108, the resistance variable layer 102 and the bottom electrode 106). In embodiments where such stacking structure is laterally surrounded by the capping layer 110, the dielectric layer 118 is in lateral contact with this stacking structure through the capping layer 110. On the other hand, the dielectric layers 120, 122 may be disposed above and below the dielectric layer 118, respectively. In those embodiments with the top conductive via 112 and the bottom conductive via 114, the dielectric layer 120 may laterally surround the top conductive via 112, while the dielectric layer 122 may laterally surround the bottom conductive via 114. Each dielectric layer may be formed of a dielectric material. For instance, the dielectric layer may include silicon oxide, silicon nitride, silicon oxynitride, the like or combinations thereof.

As described above, the resistance variable layer 102 is subjected to compressive stress (which may induce compressive strain) due to the stress field(s) applied by one or more of the top electrode 104, the bottom electrode 106 and the capping layer 110. Such compressive stress/strain may be advantageous to formation of a conductive path in the resistance variable layer 102, as well as cut off or removal of the conductive path in the resistance variable layer 102. Therefore, a programming operation and an erase operation can be performed with a lower operation voltage, and can be performed in a shorter period of time. As a result, power consumption of the memory integrated circuit 10 can be lowered, and an operation speed of the memory integrated circuit 10 can be improved.

Figure 2:
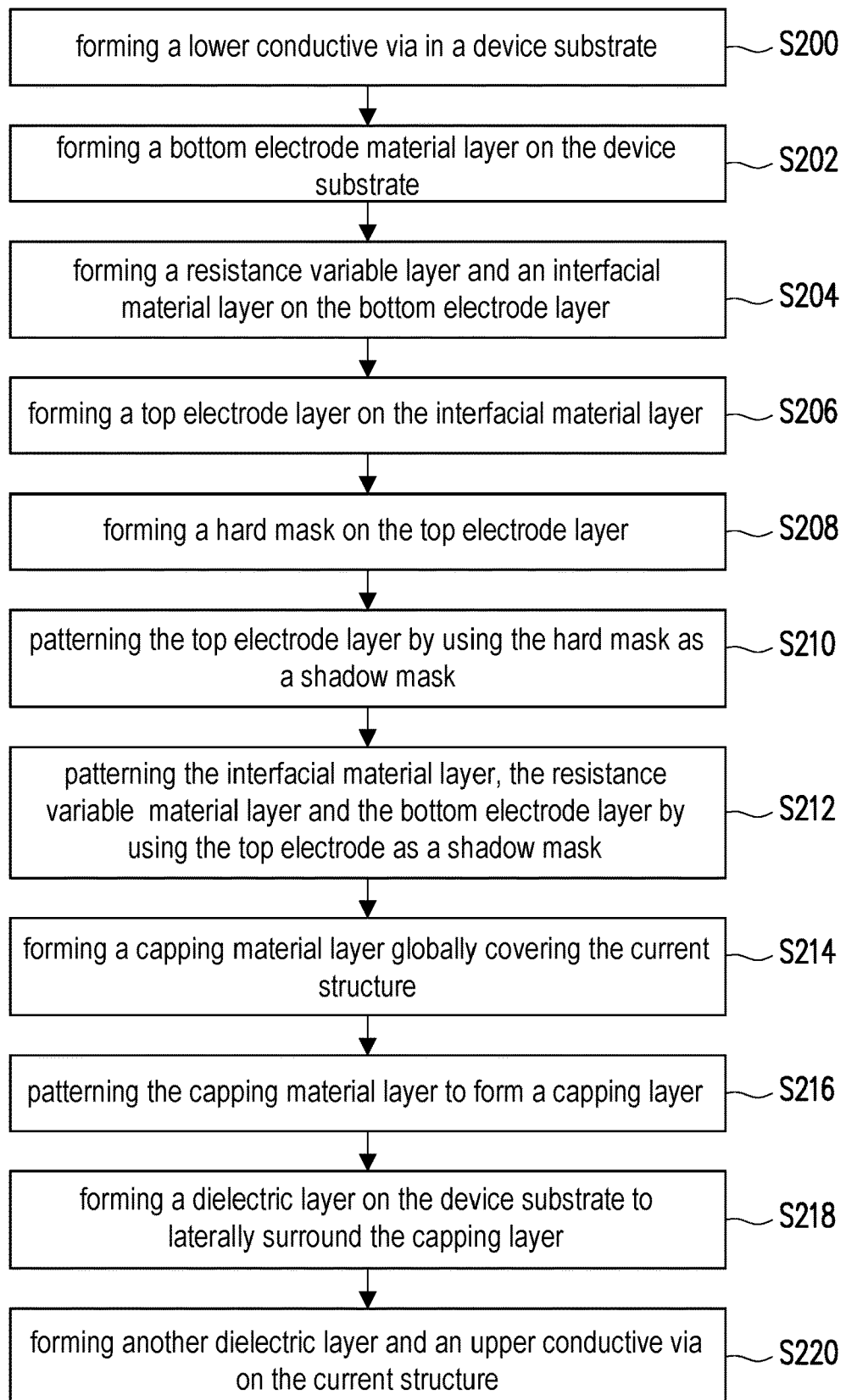
FIG. 2 is a process flow diagram illustrating a method for forming the resistance variable device as shown in FIG. 1C, according to some embodiments of the present disclosure.

FIG. 2 is a process flow diagram illustrating a method for forming the resistance variable device 100 as shown in FIG. 1C, according to some embodiments of the present disclosure. FIG. 3A through FIG. 3J are schematic cross-sectional views illustrating intermediate structures at various stages during the manufacturing process as shown in FIG. 2.

Figure 3A:
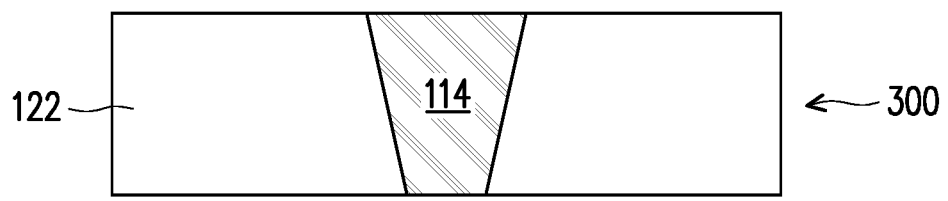
FIG. 3A through FIG. 3J are schematic cross-sectional views illustrating intermediate structures at various stages during the manufacturing process as shown in FIG. 2.

Referring to FIG. 2 and FIG. 3A, step S200 is performed, and the bottom conductive via 114 is formed in a device substrate 300. A topmost layer of the device substrate 300 may be the dielectric layer 122 as described with reference to FIG. 1C. Although not shown, the device substrate 300 may further include the access transistor 200, the conductive plugs CP and a lower portion of the BEOL structure 214 (e.g., a portion of the BEOL structure 214 no higher than the metallization layer M3) as described with reference to FIG. 1B. In some embodiments, a method for forming the bottom conductive via 114 includes a damascene process. Such damascene process may include forming a through hole in the dielectric layer 122 by a lithography process and an etching process (e.g., an anisotropic etching process), and include filling the through hole with a conductive material to form the bottom conductive via 114 by a deposition process (e.g., a physical deposition (PVD) process), a plating process or a combination thereof, along with a planarization process. For instance, the planarization process may include a polishing process, an etching process or a combination thereof.

Figure 3B:
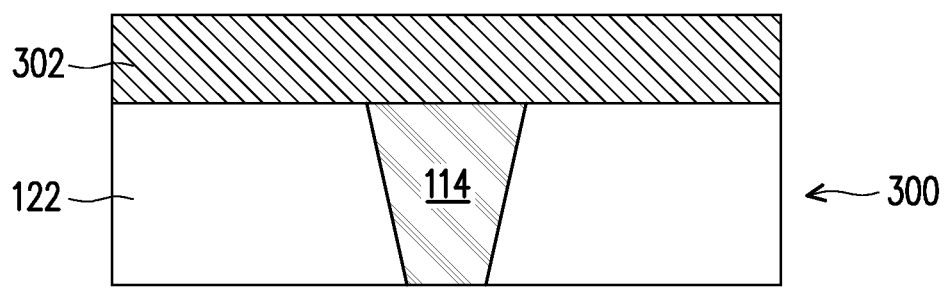

Referring to FIG. 2 and FIG. 3B, step S202 is performed, and a bottom electrode layer 302 is formed on the device substrate 300. The bottom electrode layer 302 will be patterned to form the bottom electrode 106 described with reference to FIG. 1C. In some embodiments, the bottom electrode layer 302 is formed with a tensile stress. In these embodiments, the bottom electrode layer 302 may be formed by a PVD process. In addition, the PVD process is performed with a direct current (DC) power source and a radio frequency (RF) alternating current (AC) power source. By adjusting power and/or other process parameters of the DC and RF AC power sources, a value of the tensile stress of the deposited bottom electrode layer 302 can be modified.

Figure 3C:
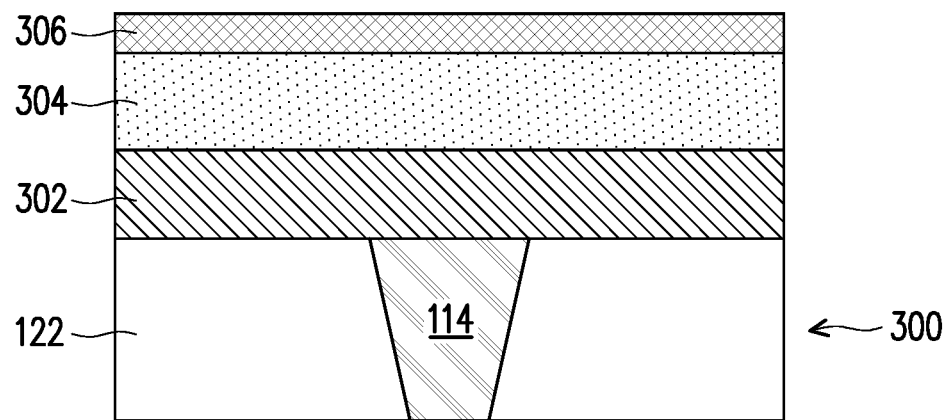

Referring to FIG. 2 and FIG. 3C, step S204 is performed, and a resistance variable material layer 304 and an interfacial material layer 306 are formed on the bottom electrode layer 302. The resistance variable material layer 304 will be patterned to form the resistance variable layer 102 as described with reference to FIG. 1C, and the interfacial material layer 306 will be patterned to form the interfacial material layer 108 as described with reference to FIG. 1C. In some embodiments, the resistance variable material layer 304 may be a single layer or a multilayer structure, and a method for forming the resistance variable material layer 304 may include a chemical vapor deposition (CVD) process, an atomic layer deposition (ALD) process, a PVD process or combinations thereof. Further, in some embodiments, the interfacial material layer 306 is formed by a PVD process or an ALD process.

Figure 3D:
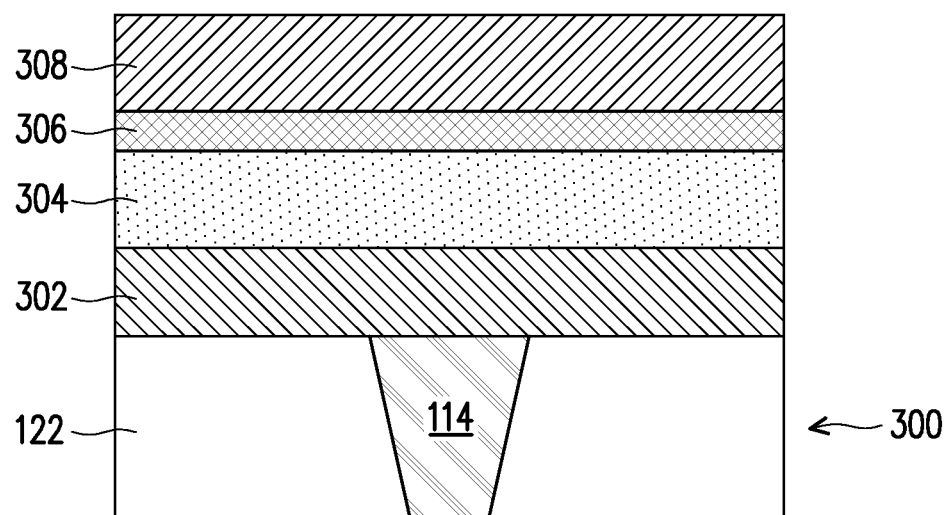

Referring to FIG. 2 and FIG. 3D, step S206 is performed, and a top electrode layer 308 is formed on the interfacial material layer 306. The top electrode layer 308 will be patterned to form the top electrode 104 as described with reference to FIG. 1C. In some embodiments, the top electrode layer 308 is formed with a compressive stress. In these embodiments, the top electrode layer 308 may be formed by a PVD process. In addition, the PVD process is performed with a DC power source, while a RF AC power source is turned off. By adjusting power and/or other process parameters of the DC power source, a value of the compressive stress of the deposited top electrode layer 308 can be modified.

Figure 3E:
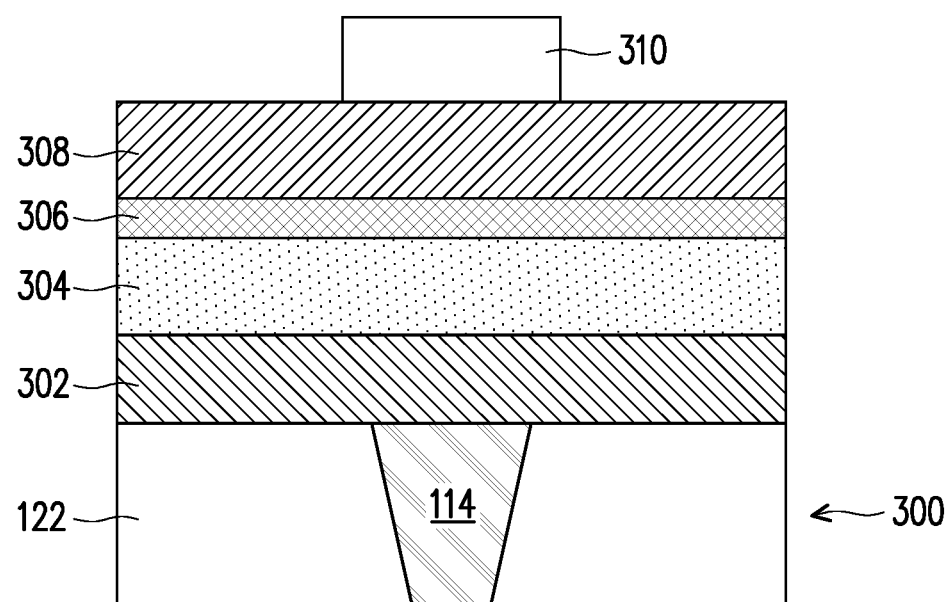

Referring to FIG. 2 and FIG. 3E, step S208 is performed, and a hard mask 310 is formed on the top electrode layer 308. The hard mask 310 will be functioned as a shadow mask during an etching process for patterning the top electrode layer 308 to define the top electrode 104. A material of the hard mask 310 may include silicon oxide. In addition, in some embodiments, a method for forming the hard mask 310 includes forming a hard mask layer on the top electrode layer 308 by a deposition process (e.g., a CVD process), and patterning the hard mask layer to form the hard mask 310 by a lithography process and an etching process.

Figure 3F:
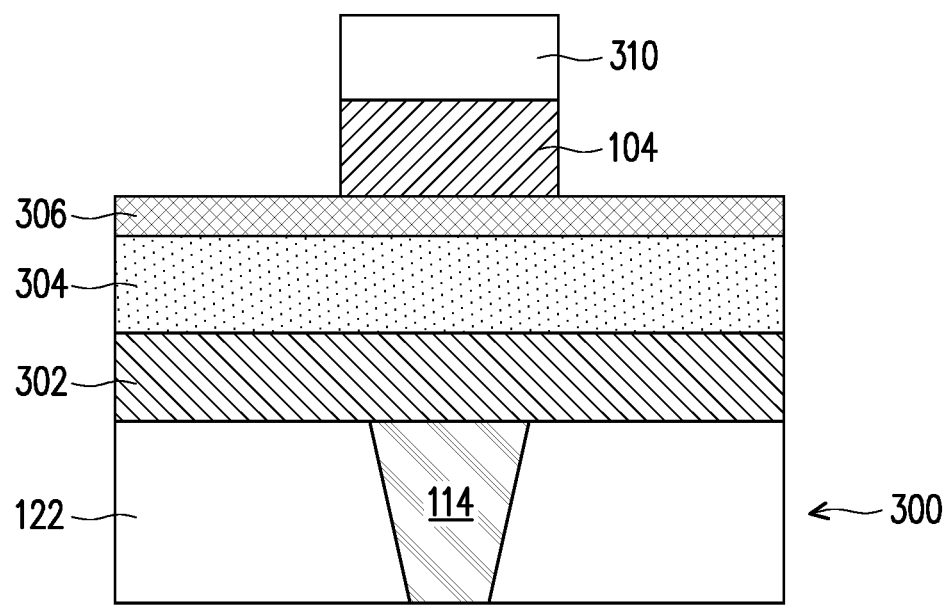

Referring to FIG. 2 and FIG. 3F, step S210 is performed, and the top electrode layer 308 is patterned by using the hard mask 310 as a shadow mask. The top electrode layer 308 is patterned to form the top electrode 104 as described with reference to FIG. 1C. In some embodiments, an etching process (e.g., an anisotropic etching process) is performed to remove portions of the top electrode layer 308, for patterning the top electrode layer 308, in order to form the top electrode 104. During the etching process, the interfacial material layer 306 may be functioned as an etching stop layer. Further, the hard mask 310 may be removed after performing the etching process. For instance, the hard mask 310 may be removed by performing an isotropic etching process.

Figure 3G:
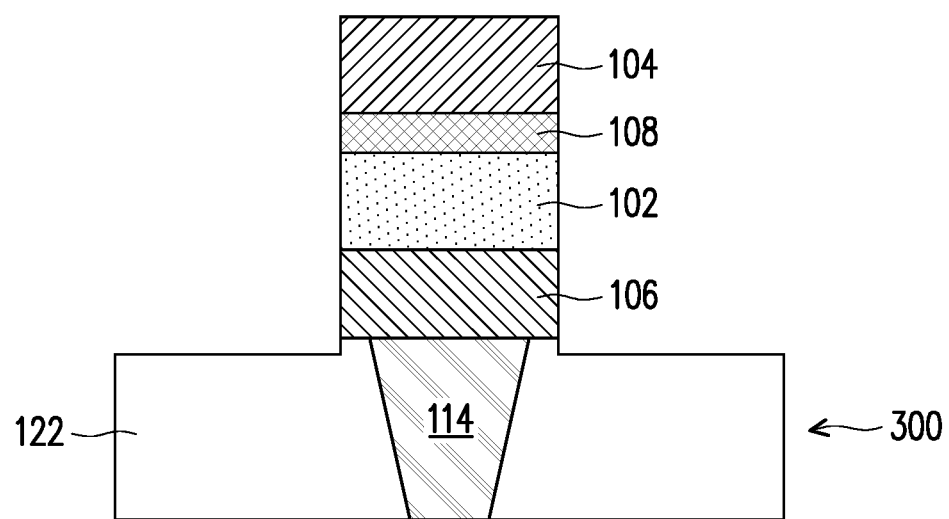

Referring to FIG. 2 and FIG. 3G, step S212 is performed, and the interfacial material layer 306, the resistance variable material layer 304 and the bottom electrode layer 302 are patterned by using the top electrode 104 as a shadow mask. The interfacial material layer 306, the resistance variable material layer 304 and the bottom electrode layer 302 are patterned to form the interfacial layer 108, the resistance variable layer 102 and the bottom electrode 106 as described with reference to FIG. 1C, respectively. In some embodiments, etching process(es) (e.g., anisotropic etching process(es)) is/are performed to remove portions of the interfacial material layer 306, the resistance variable material layer 304 and the bottom electrode layer 302, for patterning the interfacial material layer 306, the resistance variable material layer 304 and the bottom electrode layer 302 to form the interfacial layer 108, the resistance variable layer 102 and the bottom electrode 106, respectively. In some embodiments, an exposed skin portion of the dielectric layer 122 is removed during the etching process. In these embodiments, the exposed portion of the dielectric layer 122 may be recessed with respect to the covered portion of the dielectric layer 122.

Figure 3H:
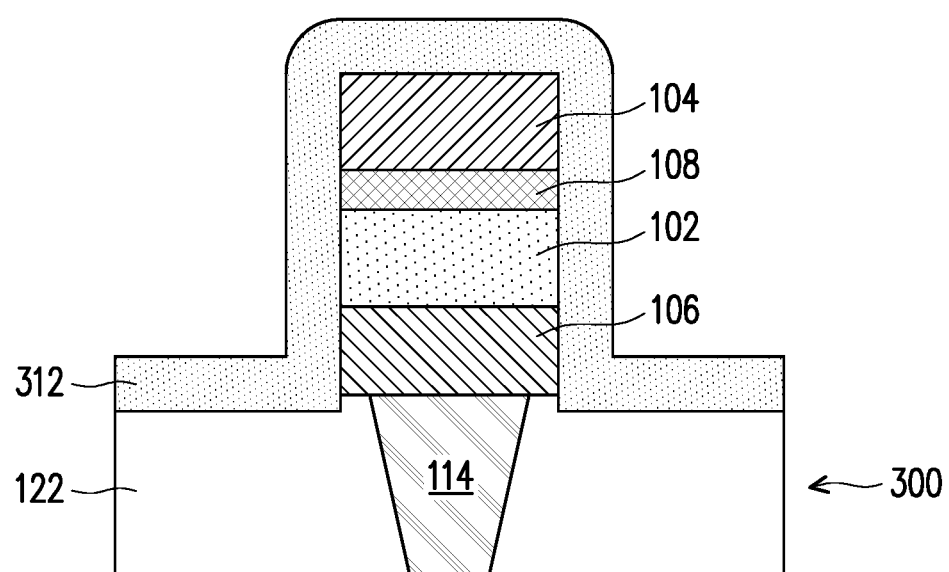

Referring to FIG. 2 and FIG. 3H, step S214 is performed, and a capping material layer 312 is globally formed on the current structure. The capping material layer 312 may globally and conformally cover the structure shown in FIG. 3G, and may be subsequently patterned to form the capping layer 110 as described with reference to FIG. 1C. In some embodiments, the capping material layer 312 is formed with a compressive stress. In these embodiments, the capping material layer 312 may be formed by a CVD process. In addition, the CVD process may be performed with a DC power source and a RF AC power source. By adjusting power and/or other process parameters of the DC and RF AC power sources, a value of the compressive stress of the deposited capping material layer 312 can be modified. In these embodiments, the capping material layer 312 may not be subjected to an ion implantation process, thus the top electrode 104, the interfacial layer 108, the resistance variable layer 102 and the bottom electrode 106 covered by the capping material layer 312 may be avoided from being damaged by the ions. However, in alternative embodiments, an ion implantation process may be used for tuning the compressive stress of the capping material layer 312.

Figure 3I:
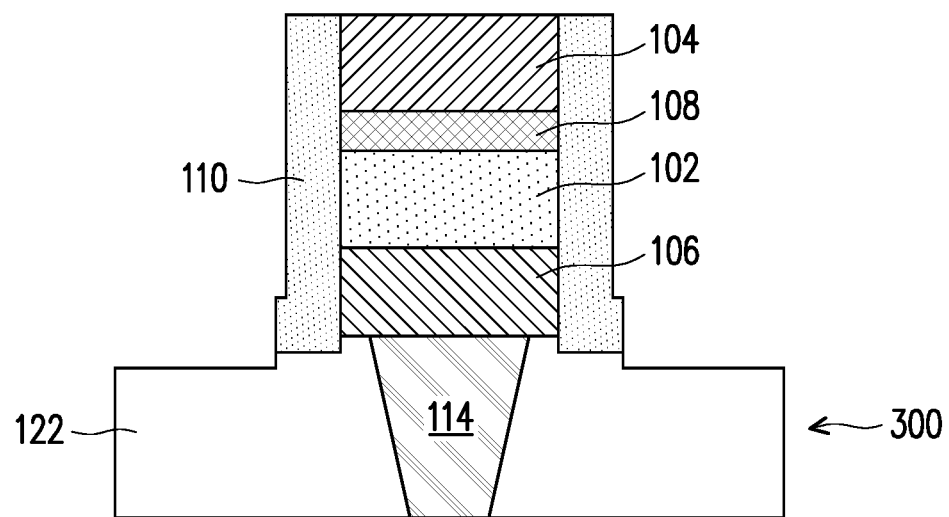

Referring to FIG. 2 and FIG. 3I, step S216 is performed, and the capping material layer 312 is patterned to form the capping layer 110 as described with reference to FIG. 1C and FIG. 1D. In some embodiments, some laterally extending portions of the capping material layer 312 are removed by an anisotropic etching process. Portions of the capping material layer 312 covering sidewalls of the top electrode 104, the interfacial layer 108, the resistance variable layer 102 and the bottom electrode 106 may remain, and form the capping layer 110 as described with reference to FIG. 1C and FIG. 1D. In these embodiments, an exposed skin portion of the dielectric layer 122 may be removed, such that the exposed portion of the dielectric layer 122 may be recessed with respect to the covered portion of the dielectric layer 122.

Figure 3J:
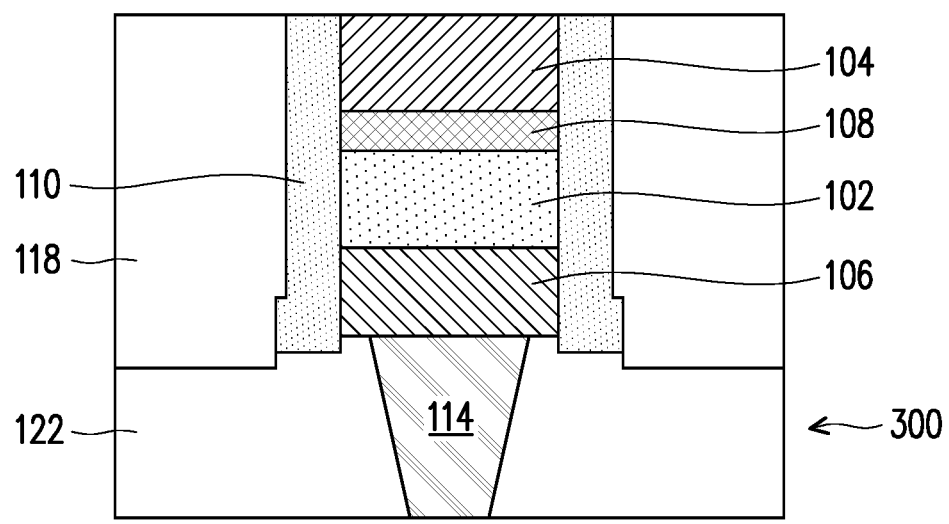

Referring to FIG. 2 and FIG. 3J, step S218 is performed, and the dielectric layer 118 is formed on the device substrate 300 to laterally surround the capping layer 110. In some embodiments, a method for forming the dielectric layer 118 includes forming a dielectric material layer globally covering the structure as shown in FIG. 3I by a deposition process (e.g., a CVD process), and includes removing portions of the dielectric material layer above top surfaces of the top electrode 104 and the capping layer 110 by a planarization process. Remained portions of the dielectric material layer form the dielectric layer 118, and the top surfaces of the top electrode 104 and the capping layer 110 may be currently exposed. For instance, the planarization process may include a polishing process, an etching process or a combination thereof.

Referring to FIG. 2 and FIG. 1C, step S220 is performed, and the dielectric layer 120 as well as the top conductive via 112 are formed. In some embodiments, the dielectric layer 120 formed by a deposition process (e.g., a CVD process) initially covers the entire structure as shown in FIG. 3J, and a damascene process is performed to form a through hole in the dielectric layer 120, and to form the top conductive via 112 in the through hole. In these embodiments, the damascene process may include a lithography process and an etching process (e.g., an anisotropic etching process) for forming the through hole in the dielectric layer 120, and include a deposition process (e.g., a PVD process), a plating process or a combination thereof as well as a planarization process for forming the top conductive via 112 in the through hole. For instance, the planarization process may include a polishing process, an etching process or a combination thereof.

Up to here, manufacturing of the resistance variable device 100 as shown in FIG. 1C has been completed. In addition, current structure may be subjected to further process, in order to form the BEOL structure 214 as described with reference to FIG. 1B.

Figure 4:
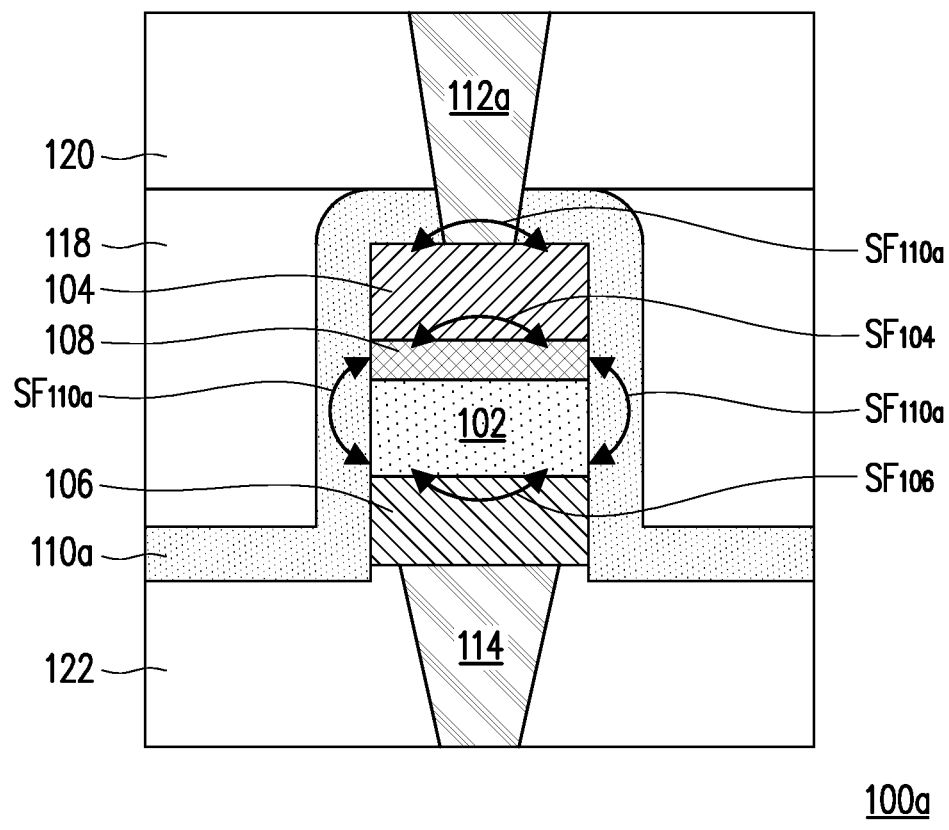
FIG. 4 is a schematic cross-sectional view illustrating a resistance variable device according to some embodiments of the present disclosure.

FIG. 4 is a schematic cross-sectional view illustrating a resistance variable device 100a according to some embodiments of the present disclosure. The resistance variable device 100a as shown in FIG. 4 is similar to the resistance variable device 100 as shown in FIG. 1C. Only differences between the resistance variable devices 100, 100a will be described, the same or the like parts would not be repeated again. In addition, similar numerical references indicate similar elements (e.g., the capping layer 110 as shown in FIG. 1C and the capping layer 110a as shown in FIG. 4).

Referring to FIG. 4, in some embodiments, the capping layer 110a with a compressive stress further covers a top surface of the top electrode 104, and has a portion laterally extending along a top surface of the dielectric layer 122. Accordingly, the capping layer 110a can provide a stress field $SF_{110a}$ toward the resistance variable layer 102 along a lateral direction as well as a vertical direction. Therefore, the resistance variable layer 102 may be subjected to a greater compressive stress (may induce greater compressive strain), and an operation voltage of a programming/erase operation performed on the resistance variable device 100a may be further lowered. In these embodiments, a top surface of the dielectric layer 118 may be substantially coplanar with a topmost surface of the capping layer 110a. Moreover, the top conductive via 112a may further penetrate through a portion of the capping layer 110a lying on the top surface of the top electrode 104, to establish electrical connection with the top electrode 104.

A manufacturing method of the resistance variable device 100a is similar to the manufacturing method of the resistance variable device 100 as described with reference to FIG. 2, FIG. 3A through FIG. 3I and FIG. 1C, except that the step described with reference to FIG. 3I may be omitted from the manufacturing method of the resistance variable device 100a. In other words, the capping material layer 312 described with reference to FIG. 3H may not be patterned to form a wall structure, but may become the capping layer 110a as described with reference to FIG. 4 after formation of the top conductive via 112a. Moreover, the through hole for accommodating the top conductive via 112 not only penetrate through the dielectric layer 120, but also the capping layer 110a, so as to expose the top electrode 104.

As above, the memory integrated circuit according to embodiments of the present disclosure may be a resistive memory integrated circuit, and the resistance variable layer in the resistance variable device of each memory cell of the memory integrated circuit is subjected to compressive stress (may induce compressive strain) as a result of the stress field(s) generated by one or more of the surrounding layers. Specifically, at least one of the top electrode and the bottom electrode at top and bottom sides of the resistance variable layer may be configured to generate a stress field toward the resistance variable layer, such that the resistance variable layer can be subjected to compressive stress (may induce compressive strain). Further, the capping layer at least covering a sidewall of the resistance variable layer may be optionally configured to generate a stress field toward the resistance variable layer from around the resistance variable layer, so as to further increase the compressive stress (and the induced compressive strain) of the resistance variable layer. Such compressive stress/strain may be advantageous to formation of a conductive path in the resistance variable layer, as well as cut off or removal of the conductive path in the resistance variable layer. Therefore, a programming operation and an erase operation can be performed with a lower operation voltage, and can be performed in a shorter period of time. As a result, power consumption of the memory integrated circuit can be lowered, and an operation speed of the memory integrated circuit can be improved.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:
1. A memory device, comprising:
   a device substrate;
   a bottom electrode, disposed on the device substrate;
   a resistance variable layer, disposed on the bottom electrode; and
   a top electrode, disposed on the resistance variable layer,
   wherein the bottom electrode is formed with a tensile stress, and the top electrode is formed with a compressive stress.

2. The memory device according to claim 1, wherein the bottom electrode and the top electrode respectively provide a stress field toward the resistance variable layer.

3. The memory device according to claim 2, wherein the resistance variable layer is subjected to a compressive stress in corresponding to the stress fields provided by the bottom electrode and the top electrode.

4. The memory device according to claim 1, wherein the bottom electrode and the top electrode are formed of the same conductive material.

5. The memory device according to claim 1, wherein a material of the bottom electrode and a material of the top electrode respectively include titanium nitride, tantalum nitride, tantalum or combinations thereof.

6. The memory device according to claim 1, further comprising:
   a capping layer, covering sidewalls of the bottom electrode, the resistance variable layer and the top electrode, and formed with a compressive stress.

7. The memory device according to claim 6, wherein the bottom electrode, the top electrode and the capping layer respectively provide a stress field toward the resistance variable layer, and the resistance variable layer is subjected to a compressive stress in correspondence to the stress fields.

8. The memory device according to claim 6, wherein the capping layer is formed as a wall structure, the wall structure laterally surrounds the bottom electrode, the resistance variable layer and the top electrode.

9. The memory device according to claim 6, wherein the capping layer laterally surrounds the bottom electrode, the resistance variable layer and the top electrode, and further covers a top surface of the top electrode.

10. The memory device according to claim 6, wherein a material of the capping layer comprises silicon nitride, aluminum nitride or a combination thereof.

11. A memory device, comprising:
    a bottom electrode with a first stress and a top electrode with a second stress, formed in a back-end-of-line (BEOL) structure over a semiconductor substrate, wherein the top electrode is located over the bottom electrode, and overlapped with the bottom electrode; and
    a resistance variable layer, sandwiched between the bottom electrode and the top electrode, and subjected to a compressive strain generated by the first stress of the bottom electrode and the second stress of the top electrode;
    wherein a direction of the first stress and a direction of the second stress are not parallel to the interfaces between the bottom electrode and the resistance variable layer and between the top electrode and the resistance variable layer.

12. The memory device according to claim 11, further comprising:
    a stressed layer, covering sidewalls of the top electrode, the resistance variable layer and the bottom electrode, and formed with a third stress.

13. The memory device according to claim 12, wherein the resistance variable layer is further subjected to a compressive strain in corresponding to the third stress of the stressed layer.

* * * * *